(12) United States Patent
Cachia (10) Patent No.: US 9,136,242 B2
(45) Date of Patent: Sep. 15, 2015

(54) COMPONENT LEG ARRANGEMENT

(71) Applicant: Control Techniques Limited, Newtown (GB)

(72) Inventor: Charles Anthony Cachia, Welshpool (GB)

(73) Assignee: Control Techniques Limited, Newtown (GB)

(*) Notice: Subject to any disclaimer, the term of this patent is extended or adjusted under 35 U.S.C. 154(b) by 71 days.

(21) Appl. No.: 13/875,794

(22) Filed: May 2, 2013

(65) Prior Publication Data

US 2013/0313715 A1 Nov. 28, 2013

(30) Foreign Application Priority Data

May 4, 2012 (GB) .................................. 1207995.0

(51) Int. Cl.
*H01L 23/48* (2006.01)
*H01L 23/00* (2006.01)
*H01L 23/495* (2006.01)

(52) U.S. Cl.
CPC .......... *H01L 24/45* (2013.01); *H01L 23/49555* (2013.01); *H01L 23/49562* (2013.01); *H01L 2924/01006* (2013.01); *H01L 2924/1306* (2013.01); *H01L 2924/13091* (2013.01)

(58) Field of Classification Search
CPC ................ H01L 2924/00; H01L 2224/48227; H01L 2924/00014; H01L 2224/73265; H01L 2224/32225
USPC ................................... 257/773, 692, 693, 696
See application file for complete search history.

(56) References Cited

U.S. PATENT DOCUMENTS 6,114,759 A 9/2000 Okuaki

FOREIGN PATENT DOCUMENTS

| EP | 1565045 | 8/2005 |
|---|---|---|
| JP | 63192258 | 8/1988 |
| JP | 7122836 | 5/1995 |
| JP | 8130285 | 11/1996 |
| JP | 3101156 | 4/2003 |
| JP | 2007227528 | 9/2007 |
| JP | 2010010533 | 1/2010 |

*Primary Examiner* — Andy Huynh
(74) *Attorney, Agent, or Firm* — Harness, Dickey & Pierce, P.L.C.

(57) ABSTRACT

An electronic component including one or more legs for attachment to a circuit board, wherein at least one of said legs includes a spring-acting kink, arranged so as to offers resilience to relative displacement between the end of said leg and the body of said component. The kink may be substantially S-shaped, Z-shaped, U-shaped, wave-shaped or coil-shaped.

11 Claims, 15 Drawing Sheets

COMPONENT LEG ARRANGEMENT

CROSS-REFERENCE TO RELATED APPLICATION

This application claims the benefit and priority of Great Britain Patent Application No. 1207995.0, filed May 4, 2012. The entire disclosure of the above application is incorporated herein by reference.

FIELD

This disclosure relates to electronic components, and has particular, but not exclusive application, to power devices such as MOSFETs and other power transistors.

BACKGROUND

Certain electronic components, for example power transistors, consume significant power in use. As a result, excess heat is generated which must be dissipated to prevent the component from overheating and causing damage thereto. Typically, heat sinks are used to absorb and dissipate heat away from such components. Free standing heat sinks may be attached to the component. Alternatively, a heat sink may be co-located with the component on a circuit board, and brought together to provide physical contact. Typically, the face of a power device is applied to a heat sink to ensure there is good thermal contact between the heat sink and the power device. This can be achieved by, for example, screwing (via a securing screw), or clipping the component to a heat sink located on the circuit board. Clipping provides better versatility with respect to assembly, and reduces the possibility of damaging the component if too much pressure is applied when screwing the component and heat sink together.

Certain components, such as power transistors, generally include three legs (referred to alternatively as "pins") for electrical and physical connection to a printed circuit board (PCB). The free ends of the legs are typically soldered to the circuit board to secure the component thereto. Often, the ends of the three legs are arranged in a row (i.e. in the same plane) when attached to the PCB. However, it is preferable to have sufficient (electrical) clearance between the component legs. This can be achieved by arranging the central leg to be offset from the outer legs, so as to form a triangular footprint on the printed circuit board beneath the component. Generally, the legs exit the body of the component in the same plane (i.e. in a row), and, in order to provide the central leg to be offset, it is typically bent in a stepped form. This term "offset" can therefore be construed as, in relation to a leg, a leg whose distal (free) end is in a different plane to the other legs.

There are, however, problems with such designs. After such a component has been fixed onto a PCB, in order to secure the face of the component to a heat sink, a lateral force is applied to the component in a direction parallel to the circuit board (and substantially perpendicular to plane of the legs and the body of the component). Non-offset designs can flex somewhat; the component body offers a degree of flexibility and "give" when the component is in situ on the circuit board, and lateral forces are applied to the component body. However, component arrangements with an offset central leg are not resilient when such lateral pressure is applied to the device. In particularly, excessive compressional and tensional forces are formed in the central leg as a result.

SUMMARY

Aspects of the invention are set out in the claims.

According to one aspect there is provided an electronic component including one or more legs, wherein at least one of said legs includes a spring-acting kink, arranged so as to offer resilience to relative displacement between the end of said leg and the body of said component.

The spring-acting kink may be arranged to offer resilience to displacement between the end of said leg and the body of said component in a direction substantially perpendicular to the plane of the body of the component and/or the plane of the other legs.

The kink may be substantially S-shaped, Z-shaped, U-shaped, wave-shaped or coil-shaped. The kink may be formed over a substantial portion of the leg's length.

The component may include three legs, and the central leg may be offset to the other two legs, and the central leg includes said spring-acting kink. The two outer legs may be substantially straight. The outer legs may include substantially S-shaped, Z-shaped, U-shaped, wave-shaped or coil-shaped kinks. The kink may be a Z or S-shaped kink, and at least one of the bends thereof, may be formed through an angle greater than 90°. At least one of the bends may be formed through an angle greater than 100°. One the bends forming the Z or S shape may have an angle of between 140 and 170°. One the bends forming the Z or S shape may have an angle of between 145 and 160°.

BRIEF DESCRIPTION OF THE DRAWINGS

Specific examples are described below by way of example only, and with reference to the accompanying drawings, of which.

OVERVIEW

Aspects of this disclosure overcome the aforementioned problems and provide for a leg (such as a central leg) to include a spring-acting kink so as to provide adequate resilience or "give" in relation to movement of the end of the leg relative to the component body. In this way, when the component is located on a circuit board and a lateral force is applied to the component body, stresses in the leg(s) are minimised. The spring-acting kink may be of any suitable design. The term "spring-acting" means that the kink offers a degree of resilience (i.e. give/flex) and thus springiness. Preferably this degree of resilience between the relative movement of the end of the leg and the body is provided in a direction which is generally perpendicular to the plane of the component body and/or plane of the component legs. The spring-acting kink may be provided by forming the leg in any appropriate form or shape.

DETAILED DESCRIPTION

Figure 1A:
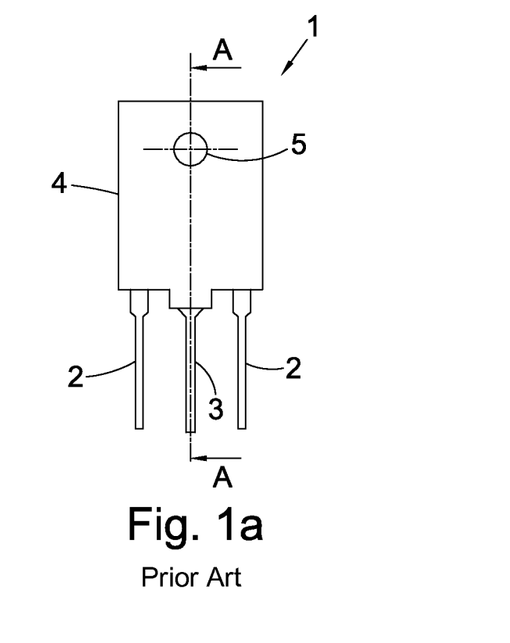
FIGS. 1a and 1b show front and cross-sectional side elevations along the line AA of a conventional power component.
Figure 1B:
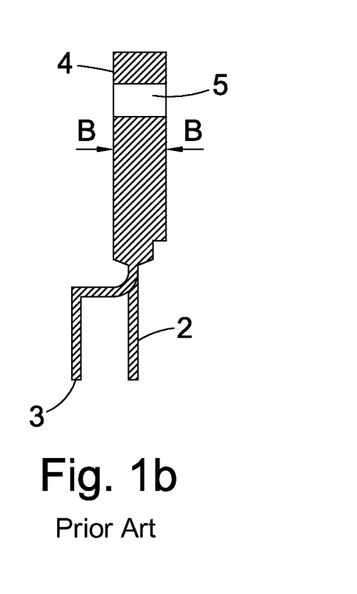

FIGS. 1a and b show respectively front and cross-sectional side elevations (along the line AA) of a conventional component 1. The component may be a power component such as a MOSFET. The component includes three legs for connection to a circuit board. The legs include two outer legs 2 which, as seen in the side elevation, are in the same plane, and a central leg 3 which is offset from the outer legs. All the legs are connected to the component body 4 in the same plane, i.e. in a row. A hole 5 may be provided in the body of the component to assist connection to a heat sink located on a circuit board, by means of a screw. Alternatively, the heat sink may be applied to the component by spring means. The central leg includes a stepped portion 6 to provide the requisite spacing and offset design. When bringing the heat sink and the face of the component together (when they are both fixed to a PCB), a force is exerted in a lateral direction, along the general direction of arrows B. This can result in severe and undesirable stresses being formed in the legs, and in particular the central leg.

Figure 2A:
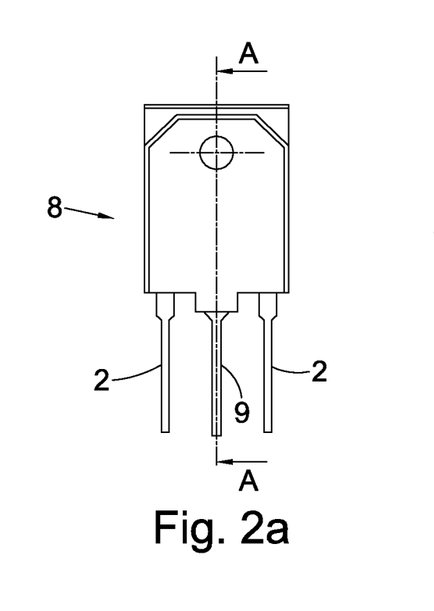
FIGS. 2a and 2b show front and cross-sectional side elevations along the line AA of a power component.
Figure 2B:
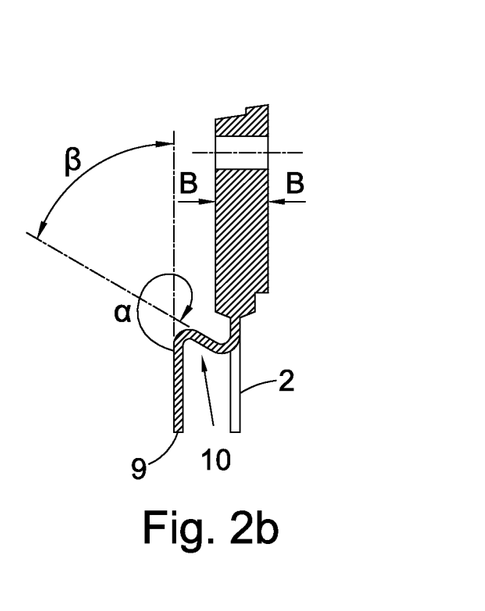

FIGS. 2a and b show respectively front and cross-sectional side elevations of a component 8. The component includes three legs for connection to a circuit board. The legs comprise two outer legs 2 which, as seen in the side elevation, are in the same plane, and a central leg 9 which, as in the FIG. 1 design, is offset from the outer legs. The central leg is offset and includes a substantially S-formed kink 10 when viewed in the side elevation, which is a spring-acting kink. This is preferably formed along a substantial length of the leg. The S-formed kink is formed such that one or both bends of the kink, is bent about an angle, $\alpha$, which is greater than 90° and preferably greater than 100°. Preferably, the angle $\alpha$ is between 120 and 140°. In the figure, this angle is 130°; the angle $\beta$ is thus 50°.

The S-formed kink allows the component to flex somewhat relative to the PCB when the component is fixed onto a PCB, and a force is exerted in a direction of arrow B, as is typically the case when a heat sink and the face of the component are brought into contact. This results in reduced stress being formed in the legs. As the outer legs are in the same general plane as the plane as the component, they already provide a degree of flexibility when forces in the direction of B are applied to the component. The S-formed kink can therefore be regarded as a spring-acting kink, offering resilience in a direction perpendicular to the plane of the component body.

Figure 3A:
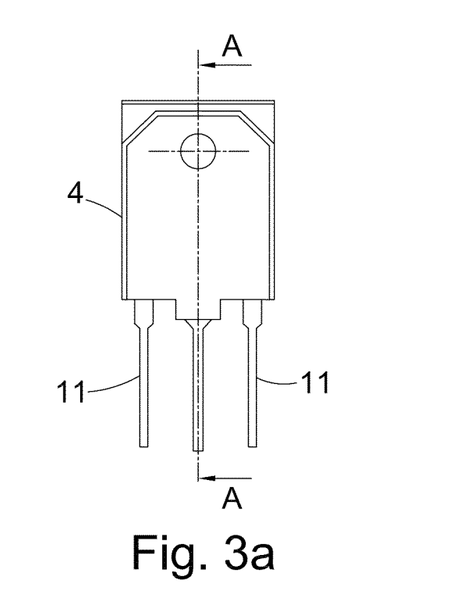
FIGS. 3a and 3b show front and cross-sectional side elevations along the line AA of a power component.
Figure 3B:
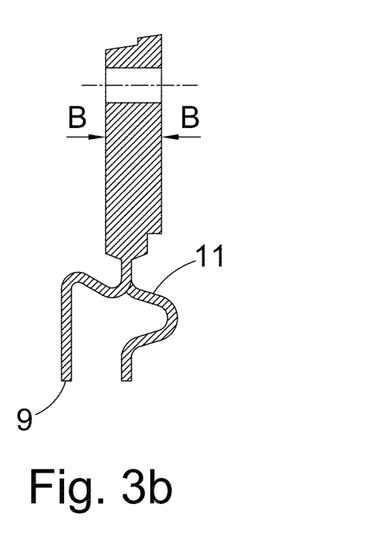

According to another aspect, the outer legs may also include kinks. FIGS. 3a and b show respectively front and cross sectional side elevations (along line AA) of a component according to such a further aspect. The central leg is again offset and includes a substantially S-formed kink when viewed in the side elevation, as in the FIG. 2 design. The two end legs 11 each include a U shaped kink, as shown in FIG. 3b. Such a design offers improved characteristics in terms of further reducing stresses when pressure is applied to the face of the component; stresses in the legs are further minimised.

The kinks in the outer legs (or central leg) may not necessarily be U-shaped but may be, e.g. V-shaped, wave-shaped or any other appropriate shape which offers a degree of resilience or "springiness".

FIGS. 4a to 4f show, and compare, the resultant stresses formed in the legs of components, when the body of the component is displaced either forward or backwards in a lateral direction relative to the end of the legs, which are fixed into a PCB (not shown). In each case, the displacement of the component body is +0.75 or −0.75 mm as described above.

Figure 4A:
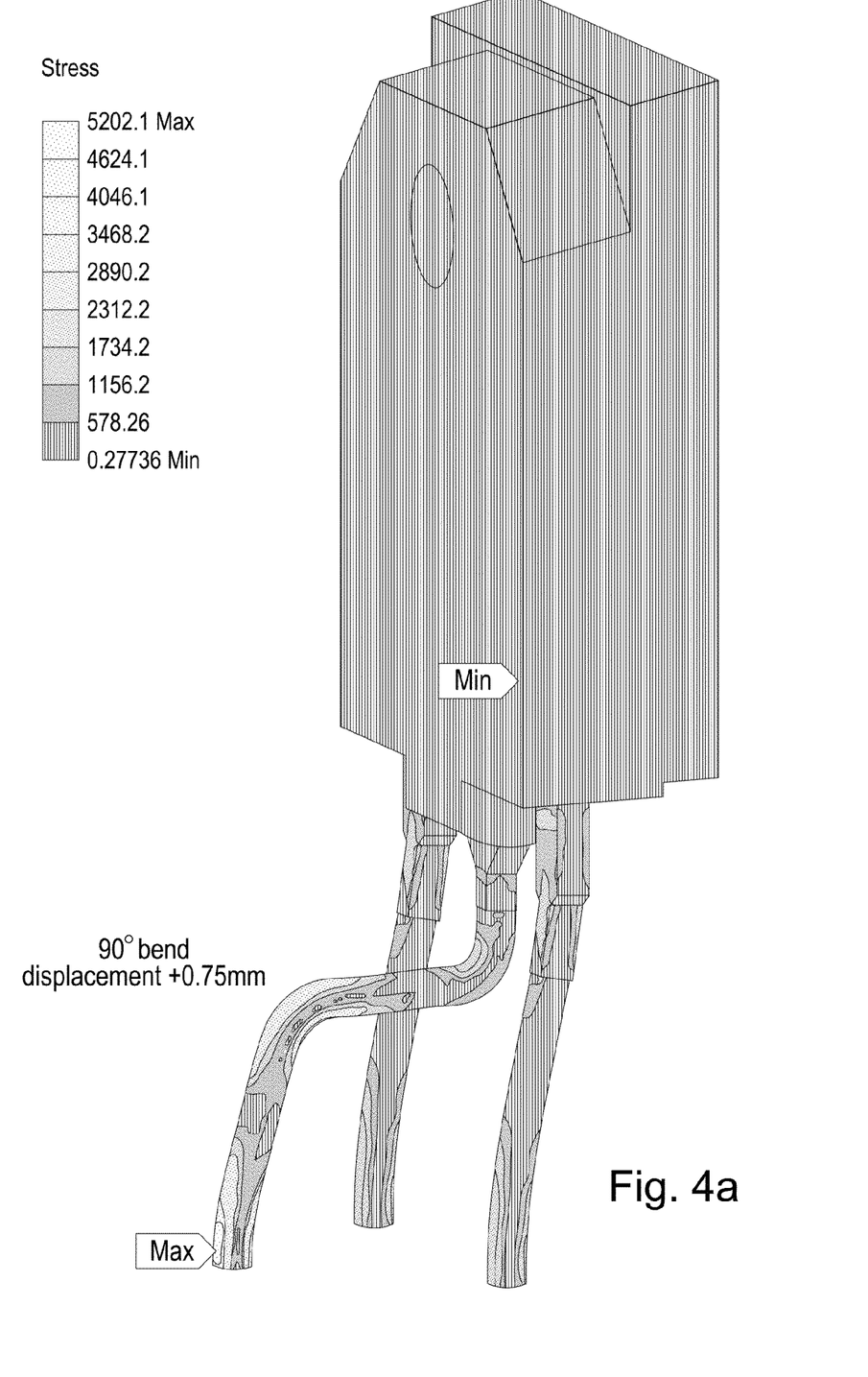
FIGS. 4a to 4f compare test results showing stresses formed in the legs of power components, when a lateral force is applied to the component body in situ.
Figure 4B:
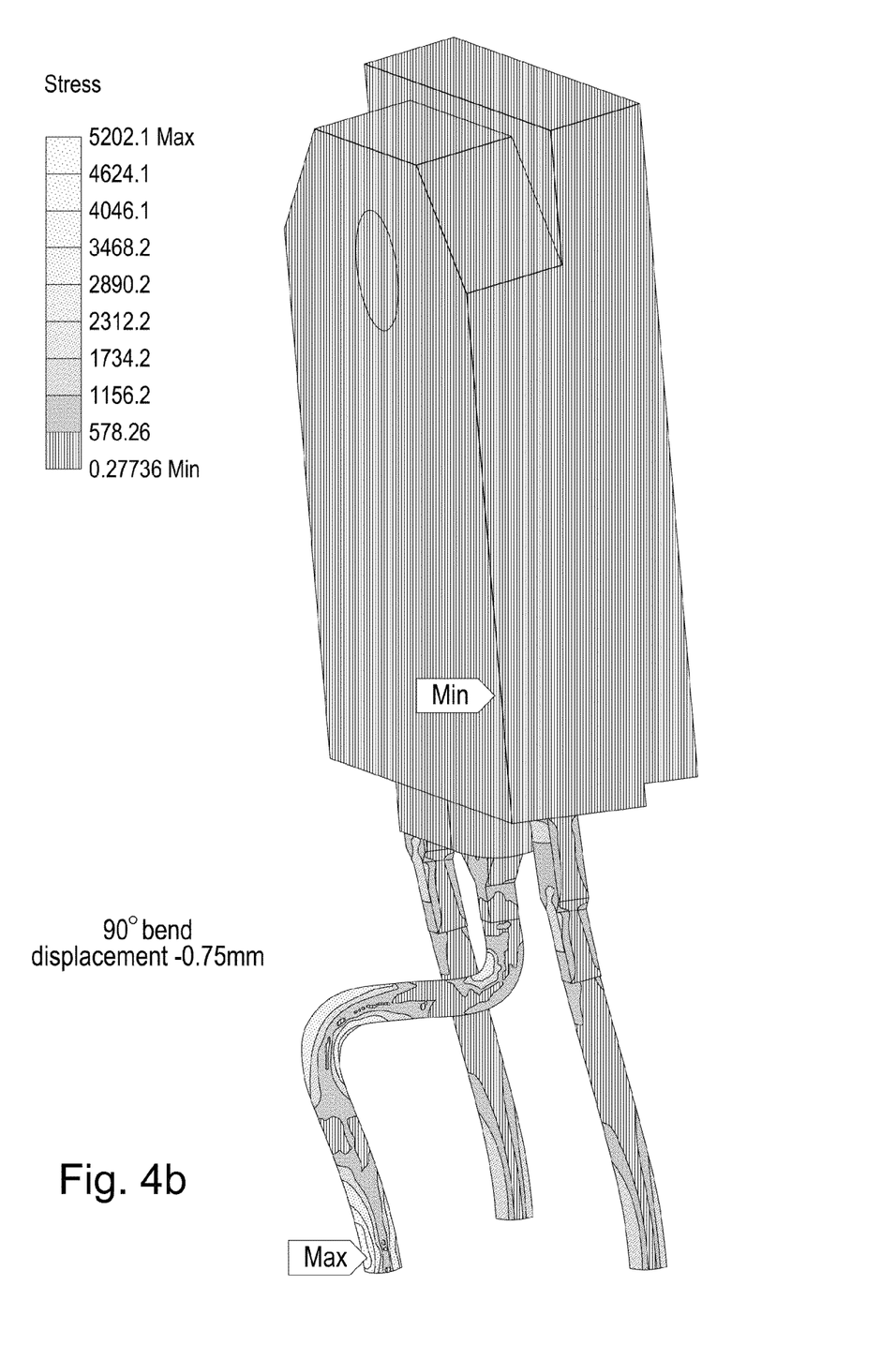

FIGS. 4a and 4b show the results for a conventional design of component which includes a stepped central leg, similar to the design described with reference to FIG. 1. The maximum stress, which occurs as the base (distal end) of the central leg, for both forward and backward displacement, is 5202 MPa.

Figure 4C:
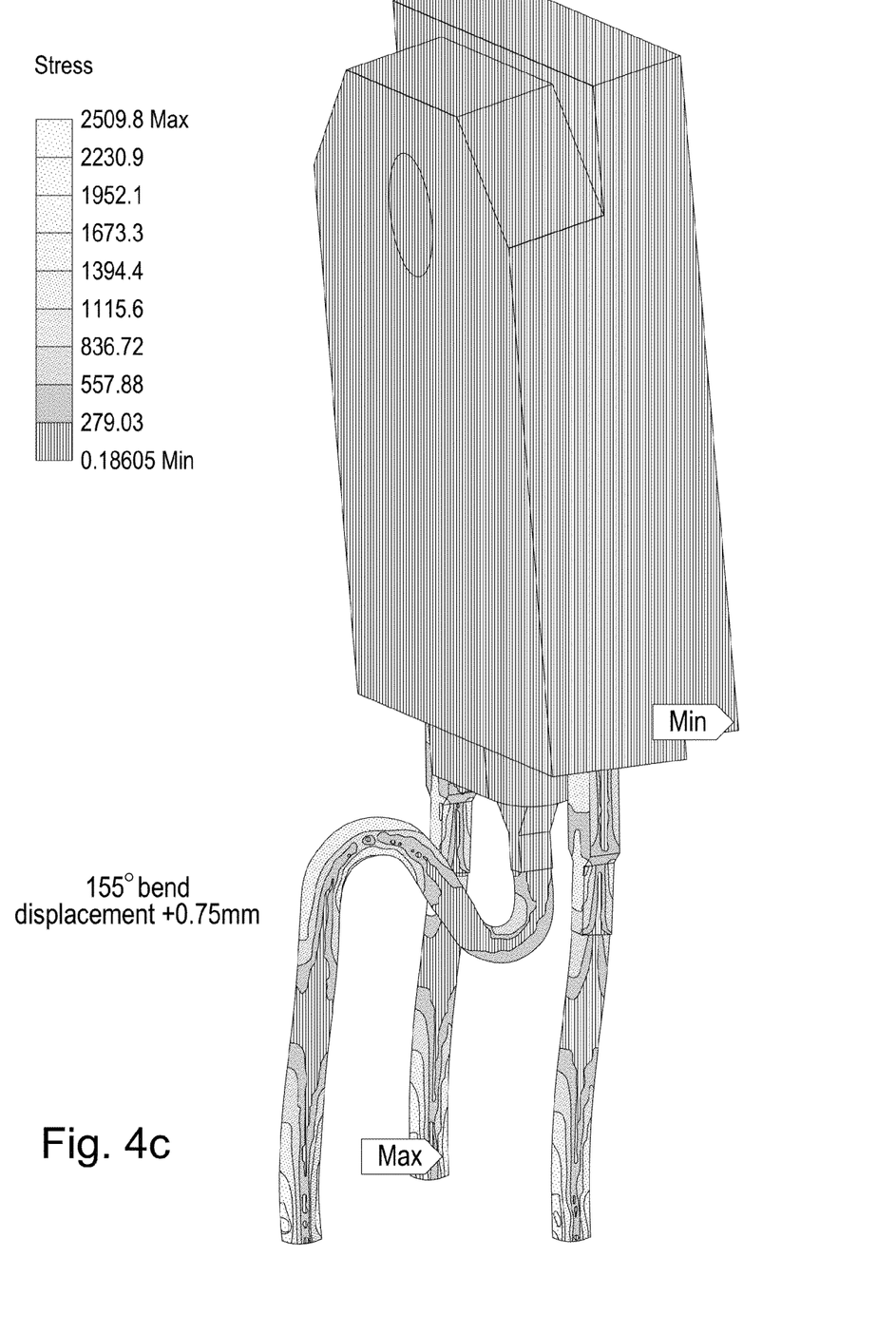
Figure 4D:
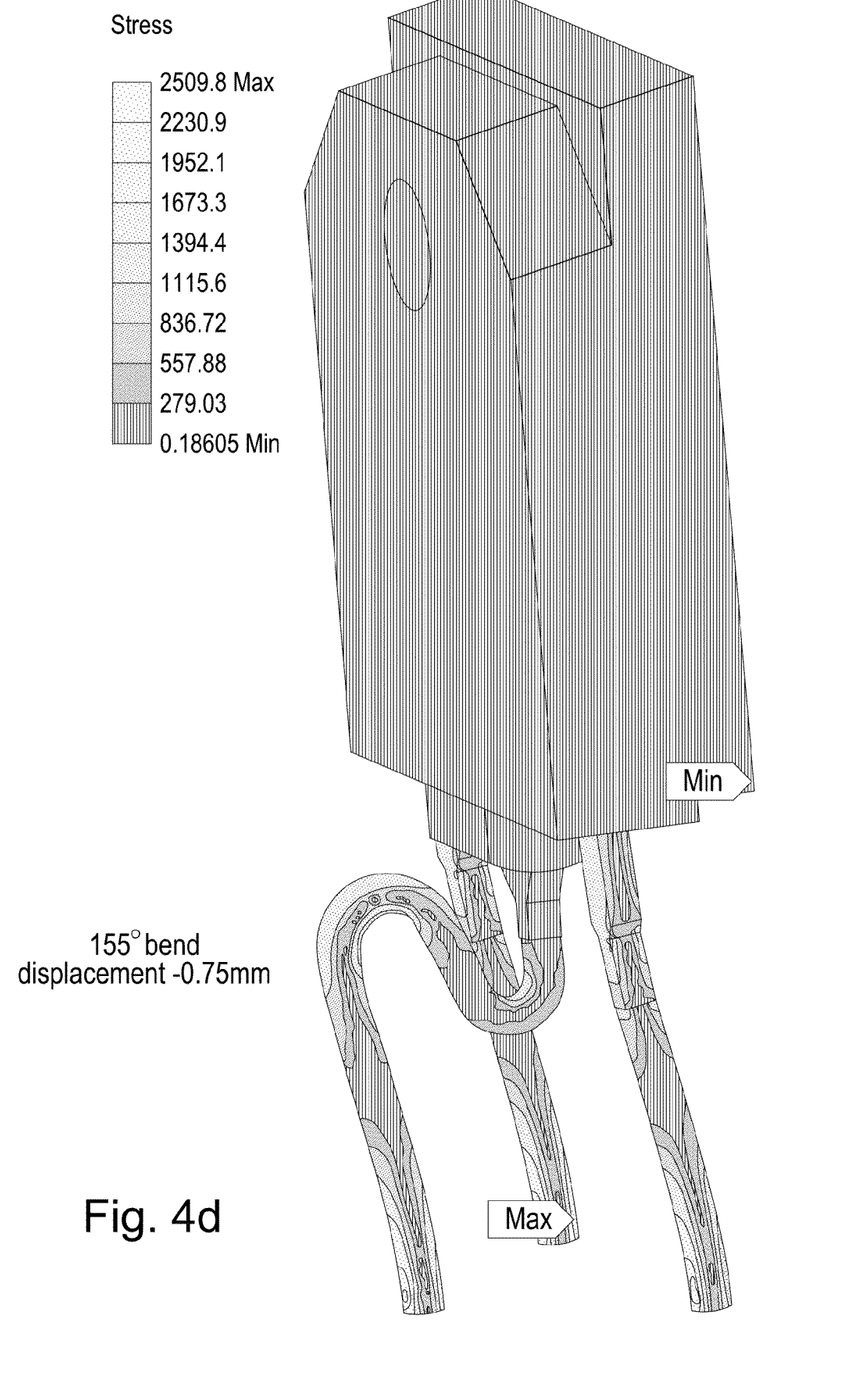

FIG. 4c and d shows the results with respect to a component which includes an S-shaped central leg (spring-acting kink) similar to the FIG. 2 example, having a 155° bend. The maximum stress induced in the legs is 2509 MPa. Thus, by incorporating an S-formed central leg, the stress is reduced by half.

Figure 4E:
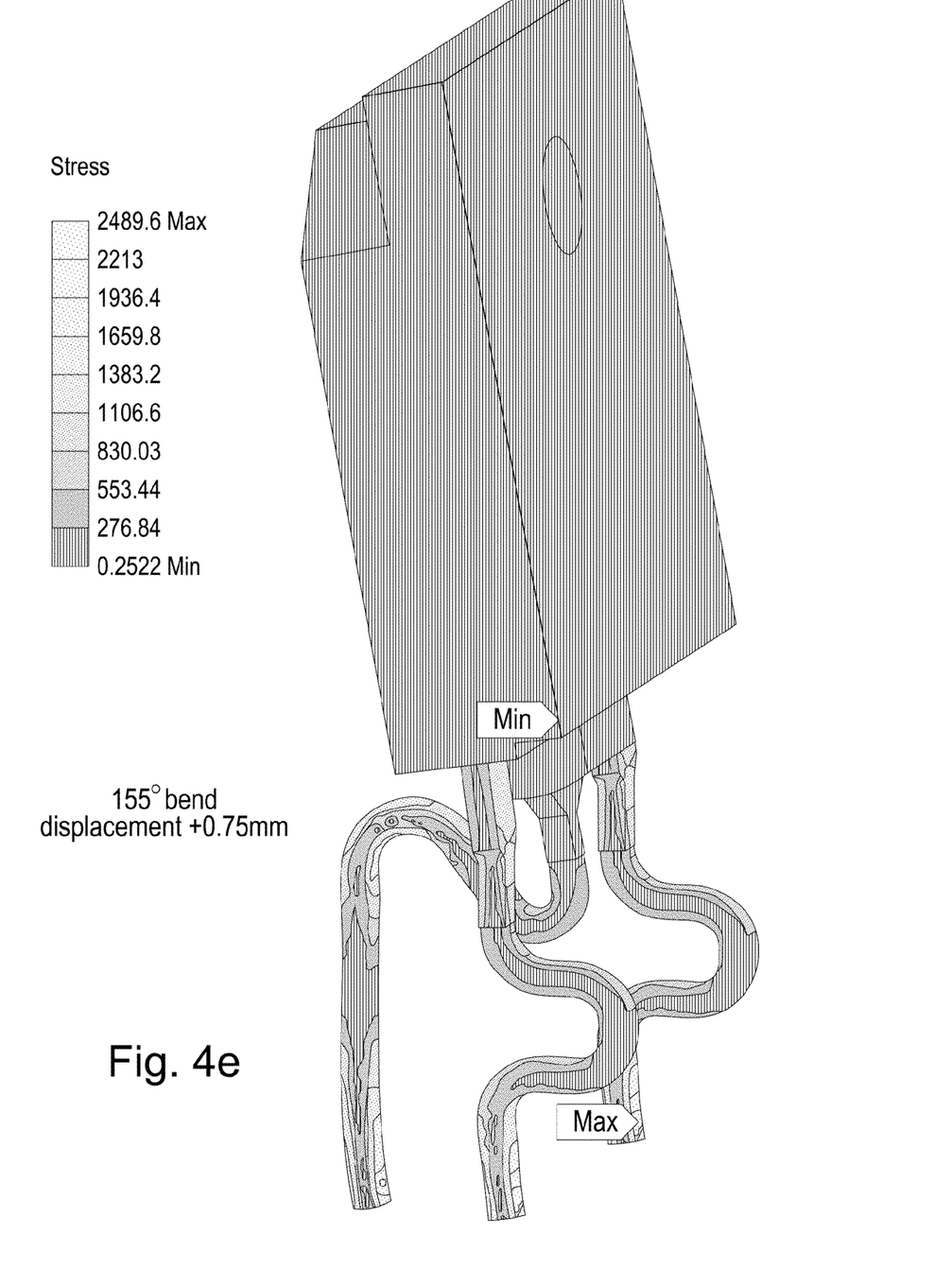
Figure 4F:
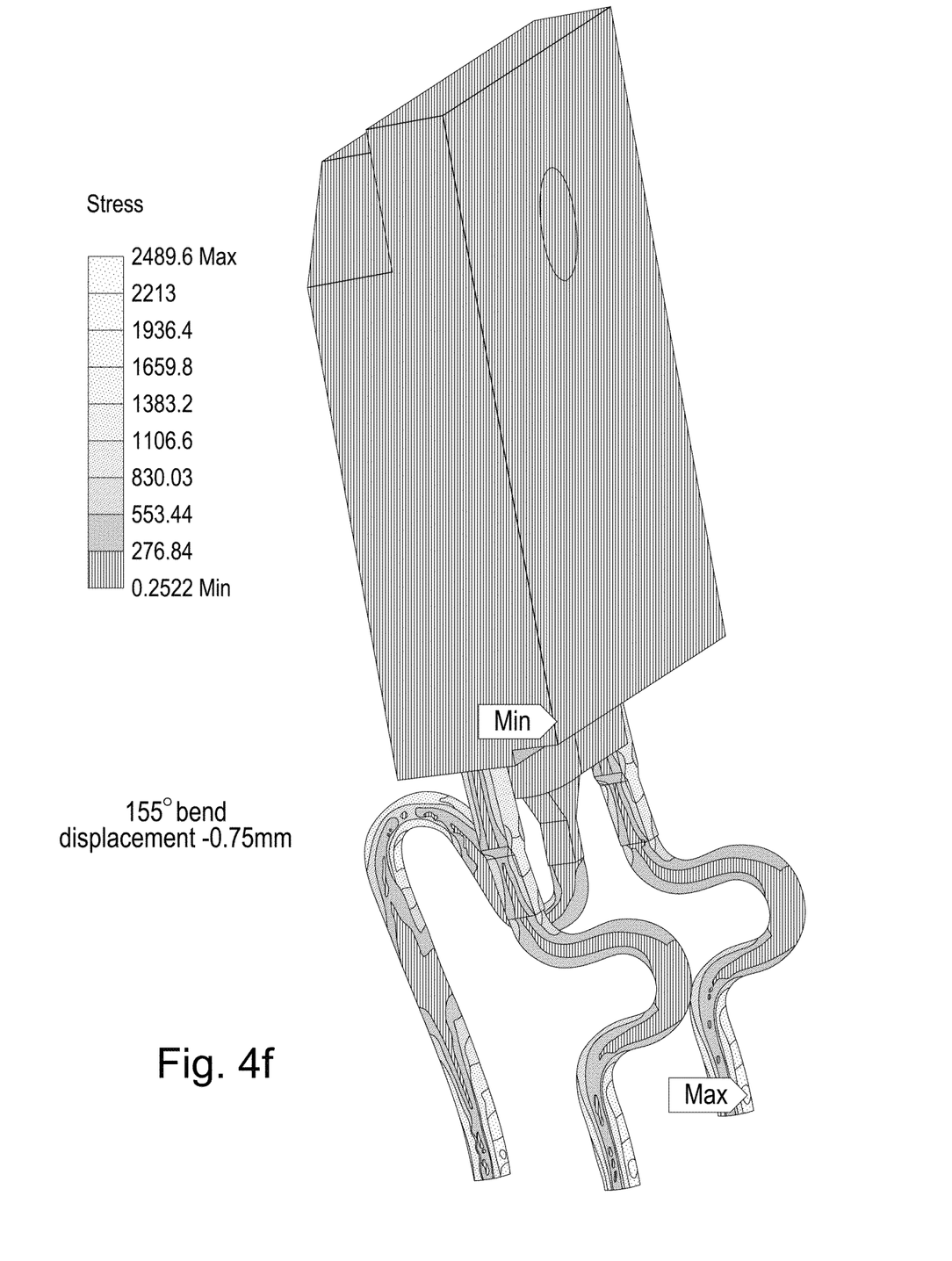

FIGS. 4e and 4f show results according to one further example, which includes an S shaped central leg and outer legs which include a U-shaped bends. The resulting stresses (for the same displacement as in the above examples) are 2489 MPa for both forward and backward displacement. Thus the U-shaped kinks in the outer legs further reduce the maximum stress.

Figure 5A:
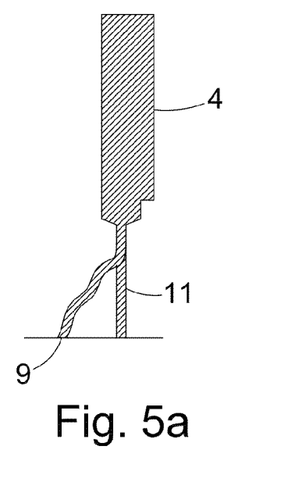
FIGS. 5a to c show further component arrangements.
Figure 5B:
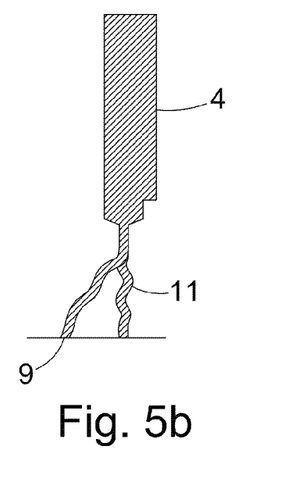
Figure 5C:
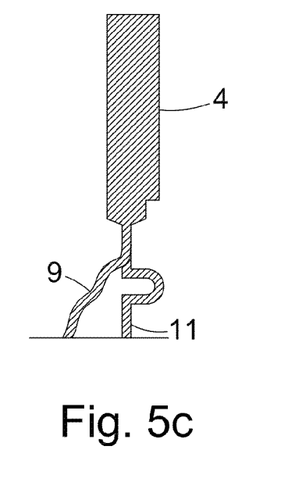

FIG. 5 shows examples of components, where the offset leg 11 includes wave shaped kink(s); the non-offset legs 11 may be straight (as in FIG. 5a), wave-formed (FIG. 5b) or with a U shaped kink (FIG. 5c).

FIGS. 7a to 7f show the component arrangements of FIGS. 4a to 4f respectively, but in line drawings without shading representing the stresses in each arrangement.

Figure 6A:
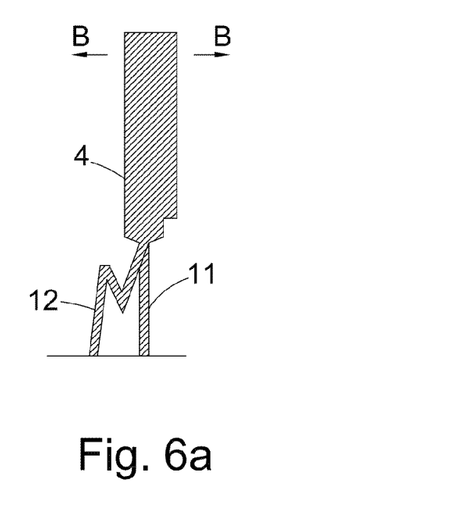
FIG. 6a and b show a front and side elevation of a power component.
Figure 6B:
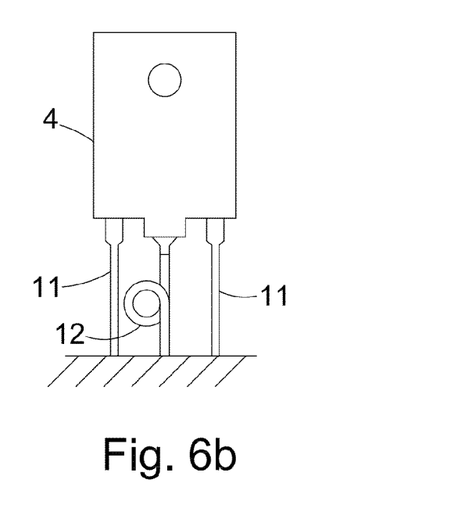
Figure 7A:
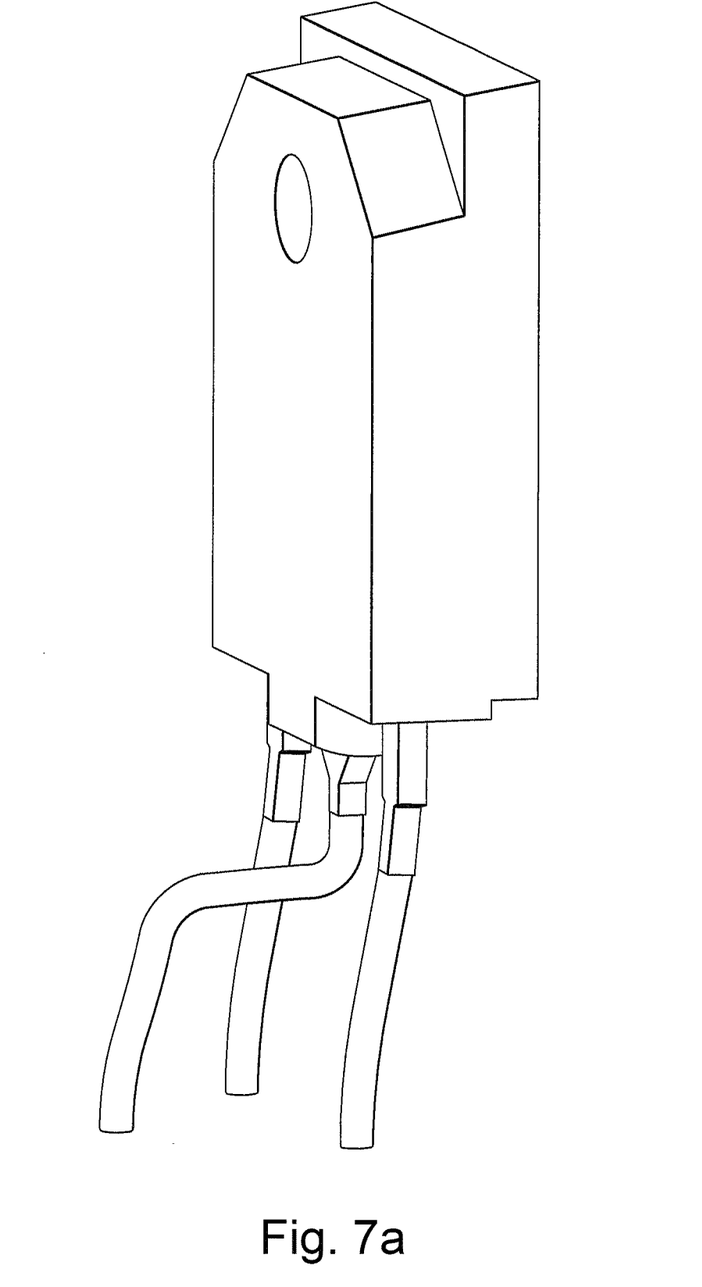
FIGS. 7a to f show outline drawings of the power component corresponding to FIGS. 4a to 4f.
Figure 7B:
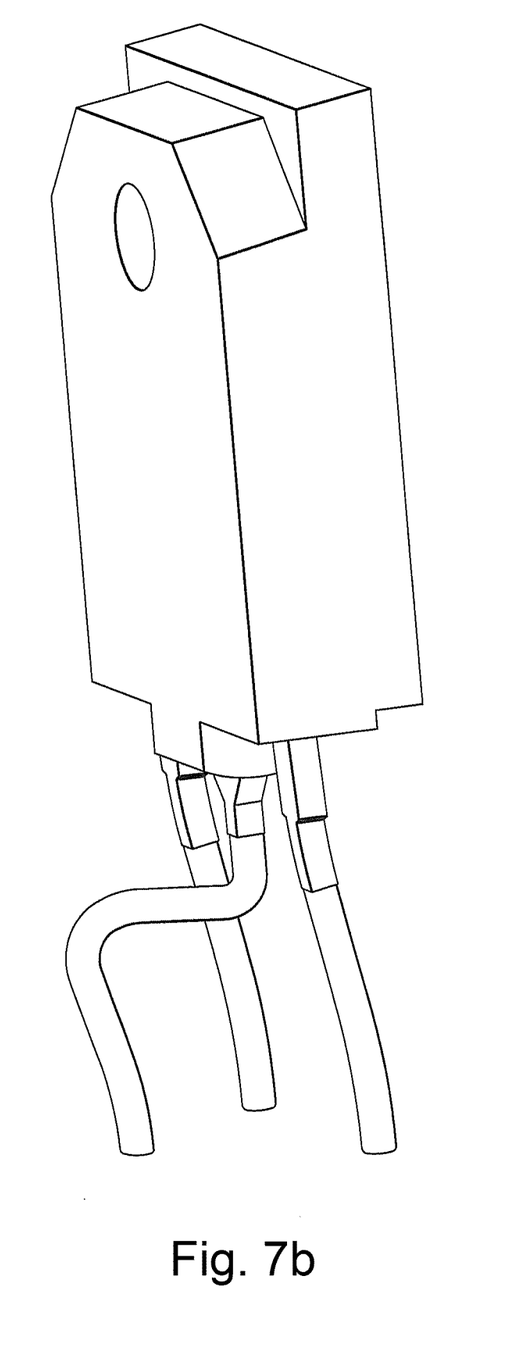
Figure 7C:
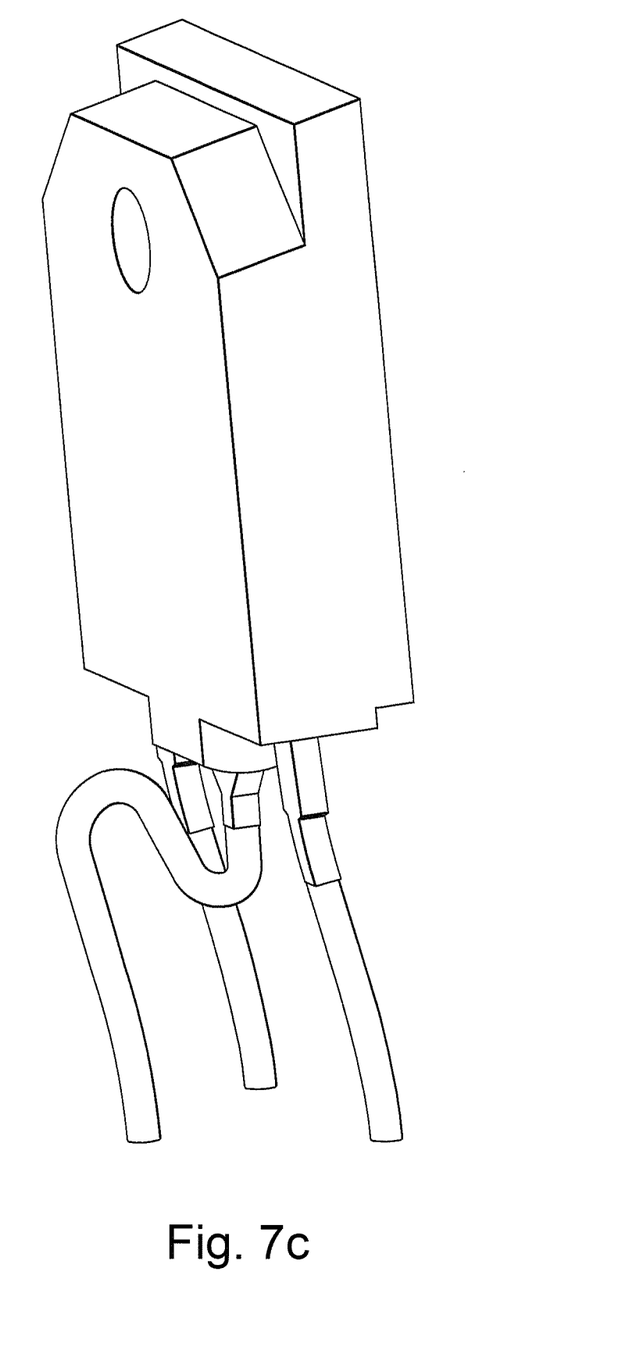
Figure 7D:
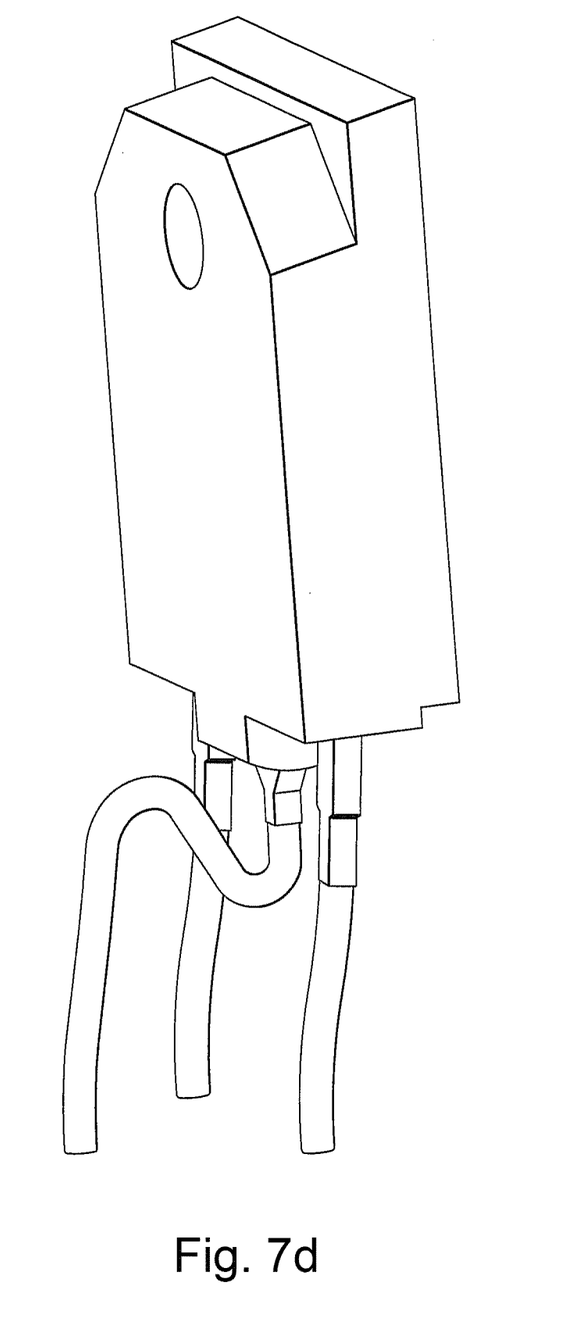
Figure 7E:
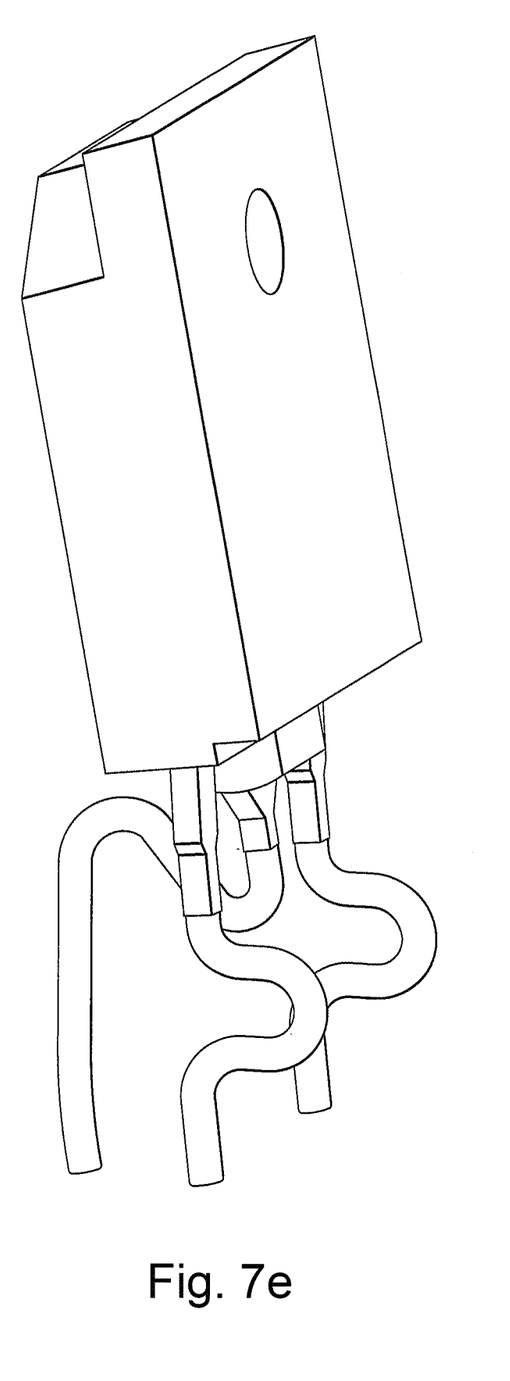
Figure 7F:
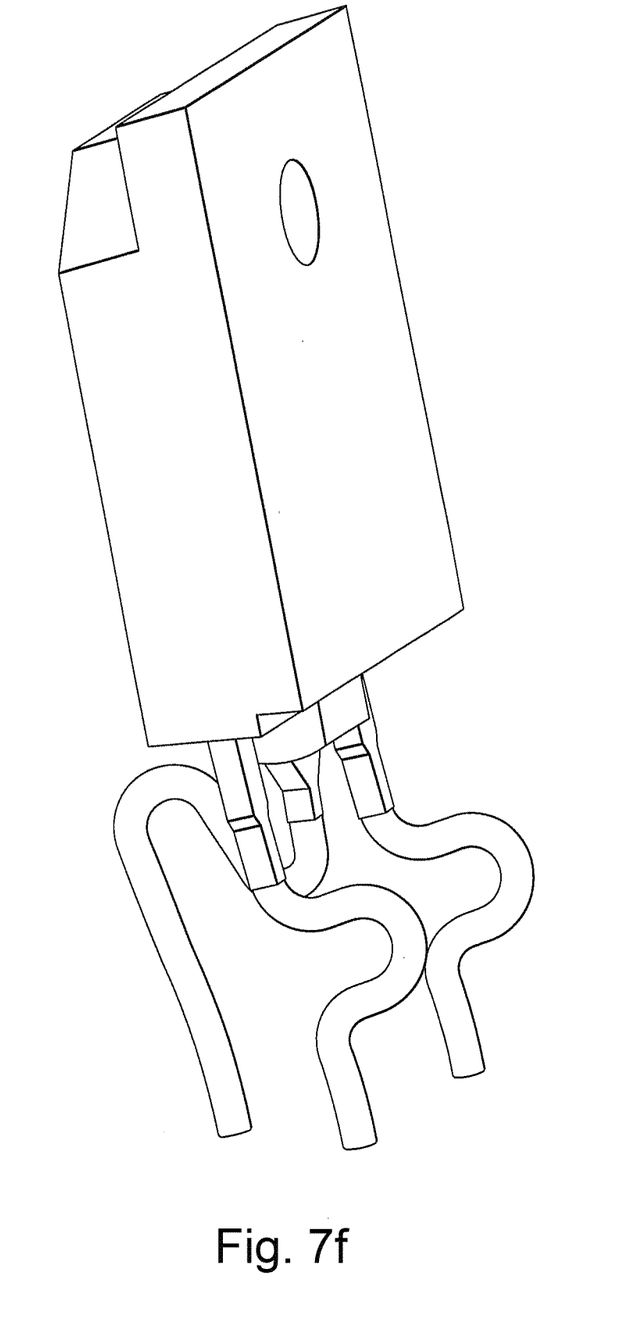

FIGS. 6a and 6b show front and side elevations respectively of a further example of a component. The outer (non-offset) legs 11 are straight and in the same plane as the component body. The central offset leg includes a spring loop 12, i.e. of a helical or part-helical form. This provides for resilience in a direction B. In alternative examples, the outer legs may also include kinks of various forms.

An advantage of the current aspects is minimised stress on the legs, when the power device is displaced. With a lower stress, the force needed to displace the device is reduced, thus making it easier for the device to be pushed against the heat sink it needs to make proper contact with for efficient heat dissipation. This in turn renders the whole arrangement of thermal contact more reliable, and results in better reliability of the power device. In short, lower stress on the legs of the power device, results in raising its reliability, and therefore increased confidence in the product into which the device is assembled.

The skilled person would understand that the invention is not limited to the above examples. Various alternative designs fall under the scope of this disclosure, and in particular, the form and combinations of kinks in each leg may be varied.

The invention claimed is:

1. An electronic component including a component body extending in a plane between a top side and a bottom side of the component body, and one or more legs extending from the bottom side of the component body for attaching the electronic component to a circuit board such that the plane of the component body initially extends in a direction perpendicular to the circuit board, wherein at least one of said legs includes a spring-acting kink, arranged, in use and in response to an applied lateral force, so as to offer resilience to relative displacement between the end of said leg and the component body in a direction parallel to a plane of the circuit board.

2. An electronic component as claimed in claim 1 wherein said kink is substantially S-shaped, Z-shaped, U-shaped, wave-shaped or coil-shaped.

3. An electronic component as claimed in claim 1 wherein said kink is formed over a substantial portion of the leg's length.

4. An electronic component as claimed in claim 1 wherein said component includes three legs, and wherein the central leg is offset to the other two legs, and wherein said central leg includes said spring-acting kink.

5. An electronic component as claimed in claim 4 wherein the two outer legs are substantially straight.

6. An electronic component as claimed in claim 5 wherein said spring-acting kink is a Z or S-shaped kink, and at least one of the bends thereof, is formed through an angle greater than 90°.

7. An electronic component as claimed in claim 6 wherein at least one of the bends is formed through an angle greater than 100°.

8. An electronic component as claimed in claim 7 wherein one the bends forming the Z or S shape has an angle of between 140 and 170°.

9. An electronic component as claimed in claim 7 wherein one the bends forming the Z or S shape has an angle of between 145 and 160°.

10. An electronic component as claimed in claim 4 wherein the outer legs include substantially S-shaped, Z-shaped, U-shaped, wave-shaped or coil-shaped kinks.

11. An electronic component as claimed in claim 10 wherein said outer legs include U-shaped kinks.

\* \* \* \* \*